(12) United States Patent
Maeda et al.

(10) Patent No.: US 6,741,144 B2
(45) Date of Patent: May 25, 2004

(54) HIGH-FREQUENCY SEMICONDUCTOR DEVICE

(75) Inventors: Masahiro Maeda, Osaka (JP); Shigeru Morimoto, Osaka (JP)

(73) Assignee: Matsushita Electric Industrial Co., Ltd, Osaka (JP)

( * ) Notice: Subject to any disclaimer, the term of this patent is extended or adjusted under 35 U.S.C. 154(b) by 62 days.

(21) Appl. No.: 10/142,599

(22) Filed: May 10, 2002

(65) Prior Publication Data

US 2002/0186091 A1 Dec. 12, 2002

(30) Foreign Application Priority Data

May 11, 2001 (JP) ........................................ 2001-141304

(51) Int. Cl.⁷ ............................... H01P 3/08; H03F 1/36
(52) U.S. Cl. .......................................... 333/127; 330/84
(58) Field of Search ............................. 333/247, 35, 33, 333/127, 128; 330/307, 295, 84

(56) References Cited

U.S. PATENT DOCUMENTS

| | | | | |
|---|---|---|---|---|
| 4,835,496 A | * | 5/1989 | Schellenberg et al. | 333/128 |
| 5,010,588 A | * | 4/1991 | Gimlett | 398/202 |
| 5,028,880 A | * | 7/1991 | Sakai | 330/84 |
| 5,162,756 A | * | 11/1992 | Taniguchi et al. | 330/295 |
| 5,412,339 A | * | 5/1995 | Takano | 330/54 |
| 5,519,233 A | | 5/1996 | Fukasawa | |
| 6,005,442 A | * | 12/1999 | Maeda et al. | 330/295 |
| 6,498,535 B1 | * | 12/2002 | Allen et al. | 330/307 |

FOREIGN PATENT DOCUMENTS

| | | |
|---|---|---|
| JP | 62-292007 | 12/1987 |
| JP | 6-349676 | 12/1994 |

* cited by examiner

Primary Examiner—Michael Tokar
Assistant Examiner—Linh V Nguyen
(74) Attorney, Agent, or Firm—Merchant & Gould P.C.

(57) ABSTRACT

There is provided a high-frequency GaAs power FET element with high performance, capable of suppressing an abnormal oscillation. Thin film resistors are provided so as to be connected electrically between incoming distributed constant lines connected electrically to FET chips, and thin film resistors are provided so as to be connected electrically between outgoing distributed constant lines electrically connected to FET chips. An unnecessary roundabout power is consumed by the thin film transistors in the incoming distributed constant lines and the outgoing distributed constant lines.

13 Claims, 12 Drawing Sheets

HIGH-FREQUENCY SEMICONDUCTOR DEVICE

BACKGROUND OF THE INVENTION

1. Field of the Invention

The present invention relates to a field-effect transistor (hereinafter, referred to as an "FET") used in a microwave band. In particular, the present invention relates to a GaAs power FET element having an internal matching circuit.

2. Description of the Related Art

There is an increasing demand for a GaAs FET as a device for mobile communication equipment such as a mobile phone, due to its excellent high-frequency characteristics. Particularly, a GaAs power FET is applied, as an amplifier of power for transmission, to a base station as well as a terminal of a mobile phone, and such an FET contributes to the miniaturization and low power consumption of the base station due to its high-output and high-efficiency characteristics. In the present specification, various high-frequency devices such as a power FET, a low-noise FET, and a mixer will be referred to collectively as a high-frequency semiconductor device.

Hereinafter, a conventional high-frequency semiconductor device will be described.

FIGS. 12A and 12B are schematic views of a conventional GaAs power FET element having an internal matching circuit. FIG. 12A is a plan view showing the inside of the FET element, and FIG. 12B is a cross-sectional view taken along a line E—E' in FIG. 12A In FIGS. 12A and 12B, a package 17 has a configuration in which a frame 16 made of ceramic is welded to a bottom portion 13 mainly made of copper. The bottom portion 13 is plated with gold. FET chips 1a and 1b are mounted substantially at a central portion of the package 17. An incoming dielectric substrate 91 made of ceramic is mounted on an input side of the FET chips 1a and 1b. An incoming distributed constant line 93 is formed on the surface of the incoming dielectric substrate 91. An outgoing dielectric substrate 92 is mounted on an output side of the FET chips 1a and 1b. An outgoing distributed constant line 94 is formed on the surface of the outgoing dielectric substrate 92. An input terminal 10 and the incoming distributed constant line 93 are connected electrically to each other via bonding wires 19. Similarly, the incoming distributed constant line 93 and the FET chips 1a, 1b; the FET chips 1a, 1b and the outgoing distributed constant line 94; and the outgoing distributed constant line 94 and an output terminal 12 respectively are connected to each other via the bonding wires 19.

In order to obtain a high-frequency power from the power FET, it is required to form an input impedance matching circuit and an output impedance matching circuit outside of the power FET so as to reduce the reflection of a high-frequency power.

Since the total gate width of the FET chips 1a and 1b is very large, the input and output impedances thereof are very low (i.e., 1 Ω or less). Thus, when it is attempted to obtain an impedance matching circuit directly in such a low impedance state, optimum matching conditions are not obtained, and a power loss becomes very large. In order to obtain power from the FET efficiently, it is important that the impedance of the FET is once converted to a high level (about 10 Ω). In general, the incoming distributed constant line 93 and the outgoing distributed constant line 94 also are called internal matching circuits and designed so as to realize such impedance conversion.

An abnormal oscillation, which can be a serious problem in using the power FET element, will be described below.

In the FET elements in FIGS. 12A and 12B, the case where there is a variation in a threshold value ($V_{th}$) and a mutual conductance (gm) between regions M and N of the FET chip 1a will be considered. For example, in the case where a high-frequency power output from the region M of the FET chip 1a is larger than that output from the region N, a roundabout power 96 is generated on the outgoing distributed constant line 94. The roundabout power 96 becomes a reflection power to the region N, whereby the impedance on the output side seen from the region N is changed. More specifically, a difference in impedance on the output side is caused between the regions M and N. As a result, a power imbalance further is increased, resulting in an abnormal oscillation. According the actual measurement, when there is a difference of 0.2 V in a threshold voltage between the regions M and N, an abnormal oscillation was caused in the vicinity of the maximum output.

Next, the case where there is a variation in $V_{th}$ and gm between the FET chips 1a and 1b will be considered. For example, in the case where a high-frequency power output from the FET chip 1a is larger than that output from the FET chip 1b, a roundabout power 97 is generated on the outgoing distributed constant line 94. When the roundabout power 97 is generated, a reflection power to the FET chip 1b is increased, resulting in a change in impedance on the output side seen from the FET chip 1b. More specifically, a difference in impedance on the output side is caused between the FET chips 1a and 1b, and the difference in high-frequency power to be output further is increased. A power imbalance is increased, resulting in an abnormal oscillation.

The abnormal oscillation is caused not only when the FET chips 1a and 1b are varied, but also when an imbalance is likely to be caused in an operation of the FET chips 1a and 1b (e.g., under a transient condition (during power-on) or when an unnecessary signal is input instantaneously). When an abnormal oscillation is caused, an interference wave not only has an adverse effect on radio communication, but also damages the FET element, which is a serious problem in terms of reliability.

SUMMARY OF THE INVENTION

Therefore, with the foregoing in mind, it is an object of the present invention to provide a high-frequency GaAs power FET element with high performance, capable of suppressing an abnormal oscillation.

In order to achieve the above-mentioned object, a first high-frequency semiconductor device of the present invention includes: an amplifier; a dielectric substrate provided on an input side or an output side of the amplifier; a plurality of transmission lines formed on a surface of the dielectric substrate and connected electrically to the amplifier; and a resistor formed on the surface of the dielectric substrate and connected electrically between the plurality of transmission lines.

In the first high-frequency semiconductor device, it is preferable that the plurality of transmission lines have an electrical length of substantially λ/4 with respect to an operation frequency, and the resistor has the same length as that of the plurality of transmission lines in a traveling direction of a high-frequency power.

In order to achieve the above-mentioned object, a second high-frequency semiconductor device of the present invention includes: first and second amplifiers; a dielectric substrate provided on an input side or an output side of the first and second amplifiers; a first transmission line formed on a surface of the dielectric substrate and connected electrically to the first amplifier; a second transmission line formed on a surface of the dielectric substrate and connected electrically to the second amplifier; and a resistor formed on a surface of the dielectric substrate and connected electrically between the first and second transmission lines.

In the second high-frequency semiconductor device, it is preferable that the first and second transmission lines have an electrical length of substantially $\lambda/4$ with respect to an operation frequency, and the resistor has the same length as those of the first and second transmission lines in a traveling direction of a high-frequency power.

In order to achieve the above-mentioned object, a third high-frequency semiconductor device includes: first and second amplifiers; a dielectric substrate provided on an input side or an output side of the first and second amplifiers; a first transmission line formed on a surface of the dielectric substrate and connected electrically to the first amplifier; a second transmission line formed on a surface of the dielectric substrate and connected electrically to the second amplifier; and a resistor and a third transmission line formed on a surface of the dielectric substrate and connected electrically between the first and second transmission lines.

In the third high-frequency semiconductor device, it is preferable that the first to third transmission lines have an electrical length of substantially $\lambda/4$ with respect to an operation frequency, and the resistor has the same length as those of the first to third transmission lines in a traveling direction of a high-frequency power.

Furthermore, in the third high-frequency semiconductor device, it is preferable that a first resistor, the third transmission line, and a second resistor are connected successively between the first and second transmission lines.

Furthermore, in the third high-frequency semiconductor device, it is preferable that a width of third transmission line is made larger on the first and second amplifier side and smaller on the other side.

In order to achieve the above-mentioned object, a fourth high-frequency semiconductor device of the present invention includes: first and second amplifiers; a dielectric substrate provided on an input side or an output side of the first and second amplifiers; first and second transmission lines formed on a surface of the dielectric substrate and connected electrically to the first amplifier; third and fourth transmission lines formed on a surface of the dielectric substrate and connected electrically to the second amplifier; a first resistor connected between the first and second transmission lines; a second resistor connected between the second and third transmission lines; and a third resistor connected between the third and fourth transmission lines.

In order to achieve the above-mentioned object, a fifth high-frequency semiconductor device of the present invention includes: first and second amplifiers; a dielectric substrate provided on an input side or an output side of the first and second amplifiers; first and second transmission lines formed on a surface of the dielectric substrate and connected electrically to the first amplifier; third and fourth transmission lines formed on a surface of the dielectric substrate and connected electrically to the second amplifier; a first resistor connected between the first and second transmission lines; a second resistor and a fifth transmission line connected between the second and third transmission lines; and a third resistor connected between the third and fourth transmission lines.

In order to achieve the above-mentioned object, a sixth high-frequency semiconductor device of the present invention includes: first and second amplifiers; a dielectric substrate provided on an input side or an output side of the first and second amplifiers; first and second transmission lines formed on a surface of the dielectric substrate and connected electrically to the first amplifier; third and fourth transmission lines formed on a surface of the dielectric substrate and connected electrically to the second amplifier; a first resistor connected between the first and second transmission lines; a second resistor connected between the third and fourth transmission lines; a third resistor connected to an end of the second transmission line opposed to the third transmission line; a fourth resistor connected to an end of the third transmission line opposed to the second transmission line; and a unit for connecting the third and fourth resistors electrically.

In the fourth, fifth, and sixth high-frequency semiconductor devices, it is preferable that the transmission lines have an electrical length of substantially $\lambda/4$ with respect to an operation frequency, and the resistors have the same length as those of the transmission lines in a traveling direction of a high-frequency power.

In order to achieve the above-mentioned object, a seventh high-frequency semiconductor device of the present invention includes: first and second amplifiers; a dielectric substrate provided on an output side or an input side of the first and second amplifiers; first and second transmission lines formed on a surface of the dielectric substrate and connected electrically to the first amplifier; third and fourth transmission lines formed on a surface of the dielectric substrate and connected electrically to the second amplifier; a first resistor connected between the first and second transmission lines; a second resistor connected between the third and fourth transmission lines; a first input terminal or output terminal on a power combining circuit connected electrically to a side of the first and second transmission lines opposite to a side thereof connected to the first amplifier; a second input terminal or output terminal on the power combining circuit connected electrically to a side of the third and fourth transmission lines opposite to a side thereof connected to the second amplifier; and a third resistor connected between the first input terminal and the second input terminal or between the first output terminal and the second output terminal.

In order to achieve the above-mentioned object, an eighth high-frequency semiconductor device of the present invention includes: first and second amplifiers; a dielectric substrate provided on an output side or an input side of the first and second amplifiers; first and second transmission lines formed on a surface of the dielectric substrate and connected electrically to the first amplifier; third and fourth transmission lines formed on a surface of the dielectric substrate and connected electrically to the second amplifier; a first resistor connected between the first and second transmission lines; a second resistor and a fifth transmission line connected between the second and third transmission lines; a third resistor connected between the third and fourth transmission lines; a first input terminal or output terminal on a power combining circuit connected electrically to a side of the first and second transmission lines opposite to a side thereof connected to the first amplifier; and a second input terminal or output terminal on the power combining circuit connected electrically to a side of the third and fourth transmission lines opposite to a side thereof connected to the second amplifier.

In the first, second, and third high-frequency semiconductor devices, it is preferable that widths of the transmission lines are made larger on the amplifier side and smaller on the other side.

In order to achieve the above-mentioned object, a ninth high-frequency semiconductor device of the present invention includes: an amplifier; an incoming dielectric substrate provided on an input side of the amplifier; an outgoing dielectric substrate provided on an output side of the amplifier; an incoming transmission line formed on a surface of the incoming dielectric substrate and connected electrically to the amplifier; and an outgoing transmission line formed on a surface of the outgoing dielectric substrate and connected electrically to the amplifier, wherein a thickness of the incoming dielectric substrate is different from that of the outgoing dielectric substrate.

In the ninth high-frequency semiconductor device, it is preferable that either the incoming transmission line or the outgoing transmission line is provided as a plurality in number, and a resistor is connected between the plurality of transmission lines.

Furthermore, in the ninth high-frequency semiconductor device, it is preferable that a width of the incoming transmission line is equal to that of the outgoing transmission line.

These and other advantages of the present invention will become apparent to those skilled in the art upon reading and understanding the following detailed description with reference to the accompanying figures.

DESCRIPTION OF THE PREFERRED EMBODIMENTS

Figure 1A:
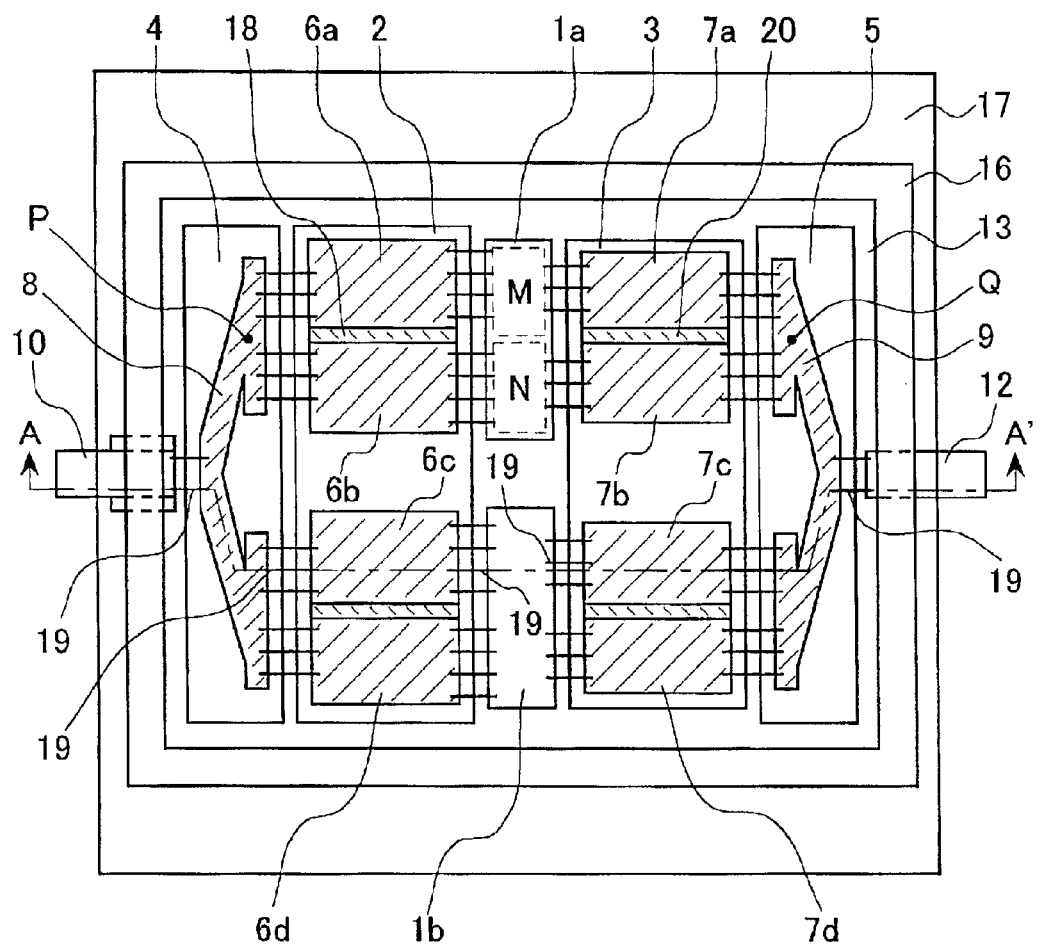
FIG. 1A is a plan view showing the inside of a GaAs power FET element having an internal matching circuit in Embodiment 1 according to the present invention.

Hereinafter, the present invention will be described by way of embodiments with reference to the drawings. Like reference numerals denote like components throughout the drawings.

Embodiment 1

Figure 1B:
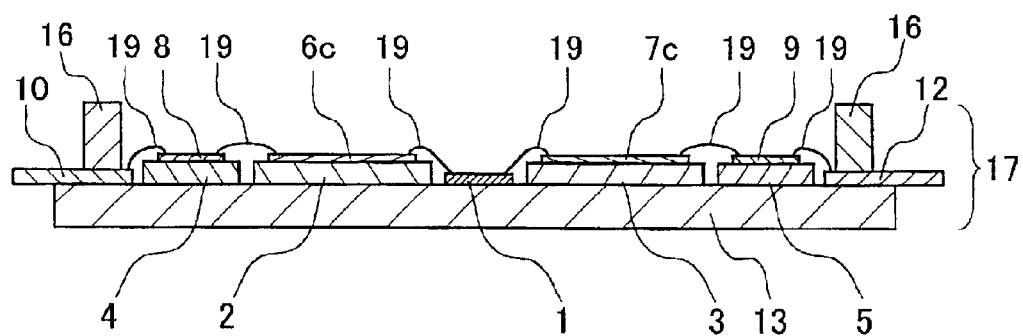
FIG. 1B is a cross-sectional view taken along a line A–A' in FIG. 1A.

FIGS. 1A and 1B are schematic views of a GaAs power FET element having an internal matching circuit in Embodiment 1 according to the present invention. FIG. 1A is a plan view showing the inside of the FET element, and FIG. 1B is a cross-sectional view taken along a line A–A' in FIG. 1A.

Figure 12A:
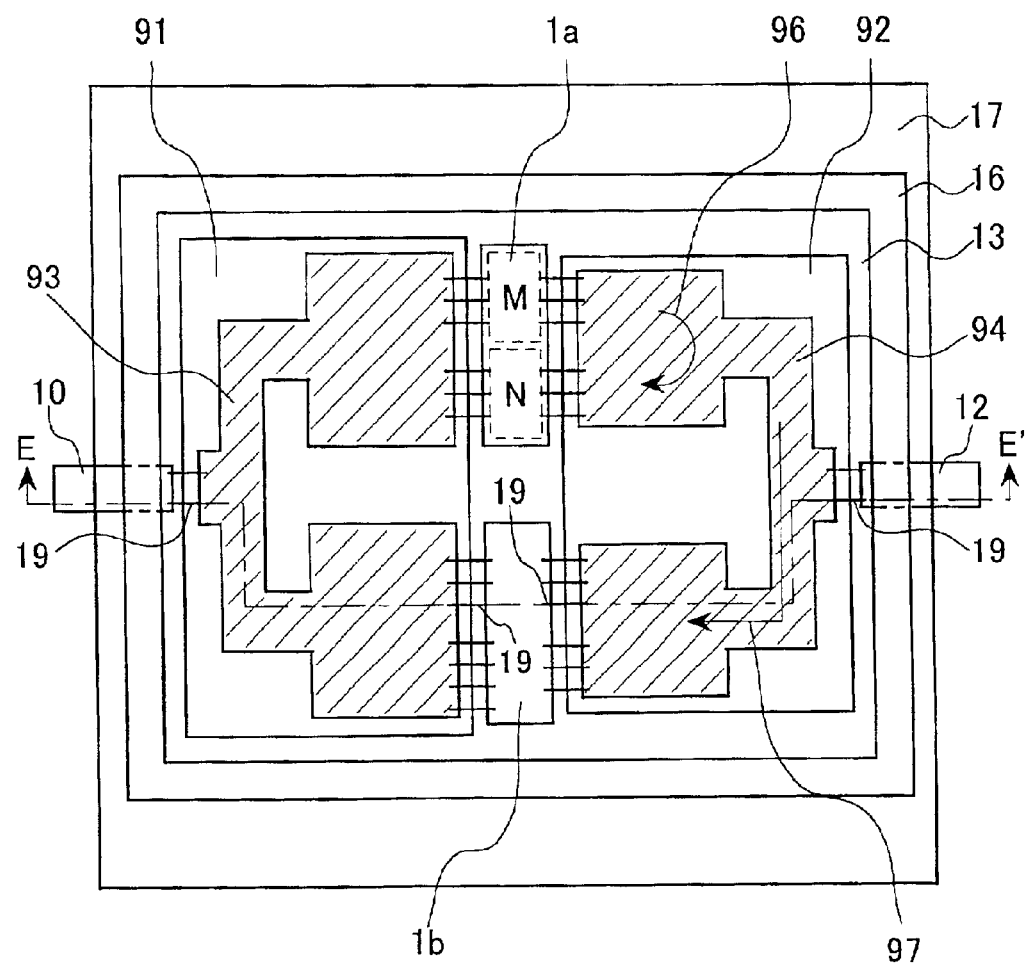
FIG. 12A is a plan view showing the inside of a conventional GaAs power FET element having an internal matching circuit.
Figure 12B:
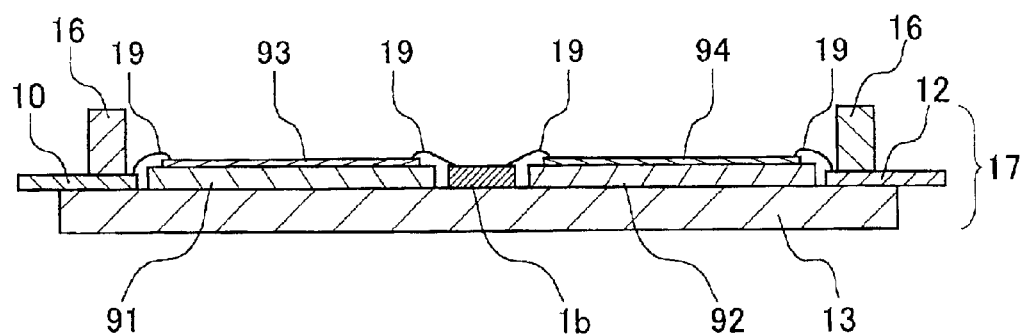
FIG. 12B is a cross-sectional view taken along a line E–E' in FIG. 12A.

The difference between the FET element of the present embodiment and the conventional FET element in FIGS. 12A and 12B resides in that an incoming distributed constant line is divided into two parts (6a and 6b) and a thin film resistor 18 is inserted therebetween, and in that an outgoing distributed constant line is divided into two parts (7a and 7b) and a thin film resistor 20 is inserted therebetween.

In FIGS. 1A and 1B, a package 17 has a configuration in which a frame 16 made of ceramic is welded to a bottom portion 13 mainly made of copper, and the bottom portion 13 is plated with gold. FET chips 1a and 1b are mounted substantially at the central portion of the package 17.

An incoming dielectric substrate 2 made of ceramic such as barium titanate is mounted on the input side of the FET chips 1a and 1b. Incoming distributed constant lines 6a, 6b, 6c and 6d having a desired characteristic impedance $Z_{01}$ or capacitance are formed on the surface of the incoming dielectric substrate 2, for example, by gold-plating. The thin film resistor 18 having a desired resistance $R_{18}$ is formed between the incoming distributed constant lines 6a and 6b.

Furthermore, an outgoing dielectric substrate 3 is mounted on the output side of the FET chips 1a and 1b. Outgoing distributed constant lines 7a, 7b, 7c, and 7d having a desired characteristic impedance $Z_{02}$ or capacitance are formed on the surface of the outgoing dielectric substrate 3. The thin film resistor 20 having a desired resistance $R_{20}$ is formed between the outgoing distributed constant lines 7a and 7b.

A power dividing substrate 4 mainly made of ceramic is mounted between the input terminal 10 and the incoming dielectric substrate 2. A power dividing circuit 8 is formed on the surface of the power dividing substrate 4.

A power combining substrate 5 is mounted between an output terminal 12 and the outgoing dielectric substrate 3, and a power combining circuit 9 is formed on the surface of the power combining substrate 5.

The input terminal 10 and the power dividing circuit 8 are connected electrically to each other via bonding wires 19. Similarly, the power dividing circuit 8 and the incoming distributed constant lines 6a, 6b, 6c, 6d; the incoming distributed constant lines 6a, 6b and the FET chip 1a; the incoming distributed constant lines 6c, 6d and the FET chip 1b; the FET chip 1a and the outgoing distributed constant lines 7a, 7b; the FET chip 1b and the outgoing distributed constant lines 7c, 7d; the outgoing distributed constant lines 7a, 7b, 7c, 7d and the power combining circuit 9; and the power combining circuit 9 and the output terminal 12 respectively are connected to each other via the bonding wires 19.

The FET chips 1a and 1b are formed on a substrate mainly made of GaAs. The finger length thereof is 500 μm with the number of fingers being 200. The total width thereof is 100 mm, and the chip size thereof is 1.5 mm×4.2 mm. The FET chips 1a and 1b output a power of 30 W at a maximum under an operation condition of a supply voltage of 12 V and a frequency of 1.9 GHz. As an FET element, a power of 60 W can be output at a maximum by dividing/combining a high-frequency power, using the power dividing circuit 8 and the power combining circuit 9.

The incoming dielectric substrate 2 has a size of 4 mm×10 mm and a thickness of 0.25 mm. The incoming distributed constant lines 6a, 6b, 6c, and 6d have a size of 3 mm×2 mm, and a characteristic impedance $Z_{01}$ of 3 Ω. The thin film resistor 18 is made of a material mainly containing tantalum nitride, and has a size of 3 mm×0.2 mm and a resistance $R_{18}$ of 5 Ω.

On the other hand, the outgoing dielectric substrate 3 has a size of 4 mm×10 mm and a thickness of 0.25 mm. The outgoing distributed constant lines 7a, 7b, 7c, and 7d have a size of 3 mm×1.5 mm, and a characteristic impedance $Z_{02}$ of 5 Ω. Furthermore, the thin film resistor 20 is made of a material mainly containing tantalum nitride, and has a size of 3 mm×0.2 mm and a resistance $R_{20}$ of 5 Ω.

Hereinafter, the roles of the incoming distributed constant lines 6a, 6b, 6c, and 6d, and the outgoing distributed constant lines 7a, 7b, 7c, and 7d will be described.

In order to obtain a high-frequency power by operating the FET element, it is required to form an input matching circuit and an output matching circuit outside of the FET element so as to reduce the reflection of a high-frequency power. Since the total gate width of the FET chips 1a and 1b is large (i.e., 100 mm), input and output impedances thereof respectively are very low (i.e., 1 Ω or less). It is difficult to form a matching circuit having an impedance of 1 Ω or less with good precision, so that optimum matching conditions cannot be obtained from the FET element with such a low impedance. Furthermore, when it is attempted to obtain power from the FET element with such a low impedance, there is a large effect of a resistance component of a wiring portion, resulting in a very large power loss.

In order to obtain power from the FET element efficiently, it is important that the impedance of the FET element is once converted to a high level (about 10 Ω). The incoming distributed constant lines 6a, 6b, 6c, 6d and the outgoing distributed constant lines 7a, 7b, 7c, 7d play such a role.

Figure 2:
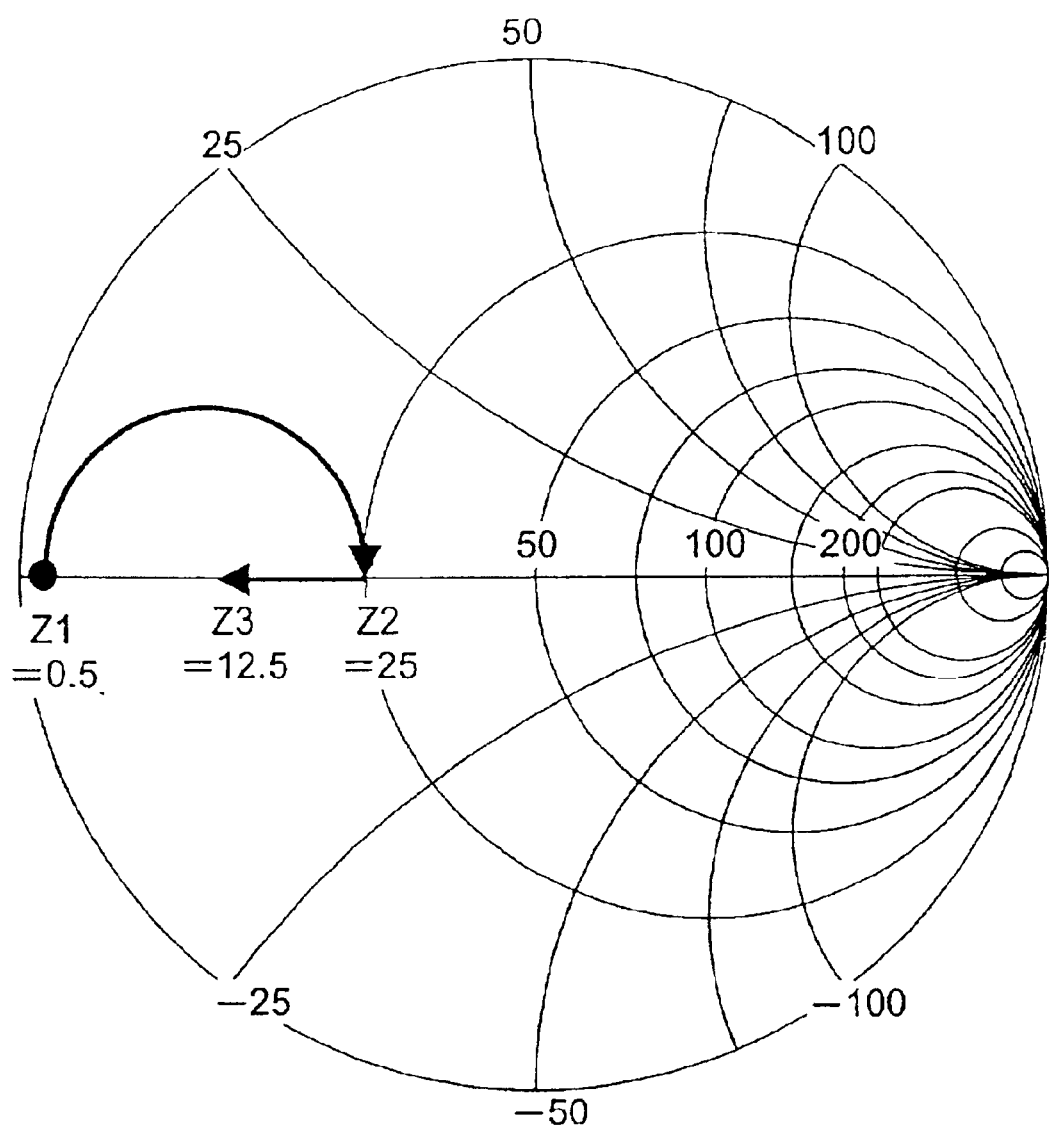
FIG. 2 is a Smith chart showing impedance matching by a distributed constant line in Embodiment 1 according to the present invention.

It is assumed that the input impedance of the FET chip 1a is Z1, the impedance in the case of seeing the FET chip 1a side from a point P on the power dividing circuit 8 is Z2, and the impedance in the case of seeing the FET chip 1a side from the input terminal 10 is Z3. FIG. 2 shows a Smith chart representing schematic impedance conversion. It is understood from FIG. 2 that the impedance is converted as follows: Z1=0.5 Ω, Z2=25 Ω, and Z3=12.5 Ω.

Next, the suppression effect of the thin film resistors 18 and 20 on an abnormal oscillation will be described.

Figure 3:
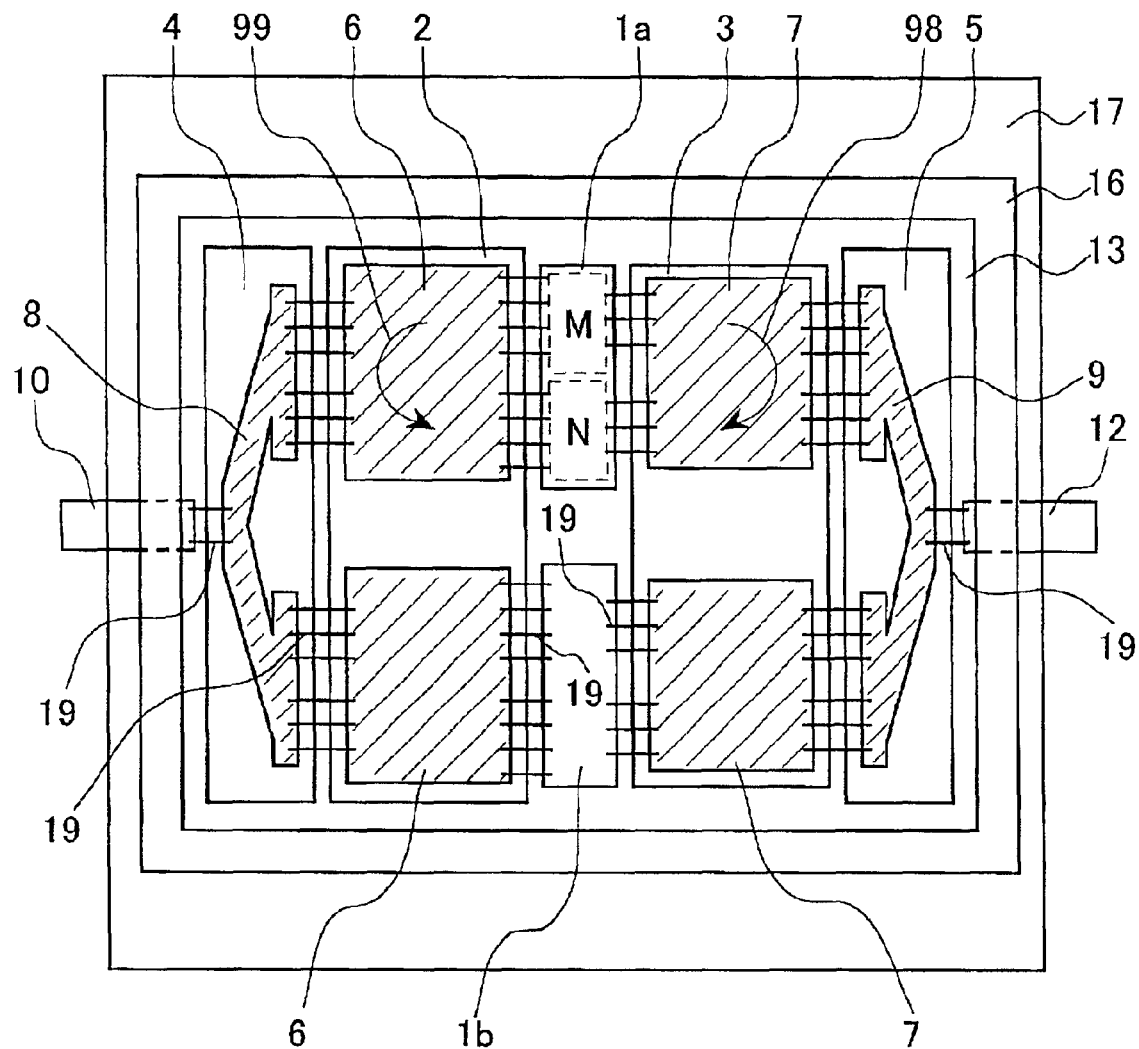
FIG. 3 is a comparison view illustrating the reason why roundabout of an unnecessary power can be eliminated in Embodiment 1 according to the present invention.

FIG. 3 is a plan view showing the inside of the FET element that does not use a thin film resistor for an internal matching circuit. Now, the case will be considered where a threshold voltage ($V_{th}$) and a mutual conductance (gm) are varied between the regions M and N of the FET chip 1a. For example, in the case where the high-frequency power output from the region M is larger than that output from the region N, a roundabout power 98 is generated in the outgoing distributed constant line 7, which increases a reflection power to the region N. Therefore, the impedance on the output side seen from the region N is changed. More specifically, the impedance on the output side seen from the FET chip 1a is varied between the regions M and N, and the difference in high-frequency power to be output is increased further. The imbalance of power is increased, resulting in an abnormal oscillation. According to the actual measurement, when there is a difference of about 0.2 V in a threshold voltage between the regions M and N, an abnormal oscillation was caused in the vicinity of the maximum output.

The reason why an abnormal oscillation can be suppressed by providing the thin film resistor 20 in the FET element shown in FIGS. 1A and 1B will be described. In the case where there is a difference in power to be output between the regions M and N, a difference is caused in power transmitted through the outgoing distributed constant lines 7a and 7b. At this time, a potential difference is formed between the outgoing distributed constant lines 7a and 7b. Due to the potential difference, a current flows through the thin film resistor 20, whereby power is consumed in an unbalanced manner. Thus, the difference in power is eliminated via the thin film resistor 20, which suppresses an abnormal oscillation. Even when there is a difference of 0.5 V in a threshold voltage between the regions M and N, an abnormal oscillation can be suppressed. Furthermore, even under transient conditions or when a signal is input instantaneously, an abnormal oscillation is not caused.

The resistance $R_{20}$ of the thin film resistor 20 and the stability with respect to an abnormal oscillation were studied in detail. A resistance component at an output impedance of the FET chip 1a is defined as R4, and a resistance component at an impedance in the case of seeing the FET chip 1a side from a point Q on the power combining circuit 9 is defined as R5. As a result of the study, it was found that when $R_{20}$ is between R4 and R5, good stability with respect to an abnormal oscillation is obtained. More specifically, in the case where R4=0.8 Ω and R5=20 Ω, it is preferable to set $R_{20}$ between 0.8 Ω and 20 Ω.

Next, the effect of the thin film resistor 18 provided between the incoming distributed constant lines 6a and 6b in FIG. 1A will be described.

In the FET element shown in FIG. 3, when there is a variation in $V_{th}$ and gm between the regions M and N of the FET chip 1a, a difference in power to be input is caused between the regions M and N of the FET chip 1a. For example, in the case where an input to the M region is small, a part of the power that is reflected without being input becomes a roundabout power 99, which is input to the region N. More specifically, an imbalance in high-frequency power to be input further is increased between the regions M and N, which finally results in an abnormal oscillation.

On the other hand, in the FET element shown in FIGS. 1A and 1B, an unnecessary roundabout power is consumed by the thin film resistor 18, so that an abnormal oscillation can be suppressed. The resistance $R_{18}$ of the thin film resistor 18 and the stability with respect to an abnormal oscillation were studied in detail. A resistance component at an input impedance of the FET chip 1a is defined as R6, and a resistance component at an impedance in the case of seeing the FET chip 1a side from a point P on the power dividing circuit 8 is defined as R7. As a result of the study, it was found that when $R_{18}$ is between R6 and R7, good stability with respect to an abnormal oscillation is obtained. More specifically, in the case where R6=0.5 Ω and R7=15 Ω, it is preferable to set $R_{18}$ between 0.5 Ω and 15 Ω.

In the present embodiment, although the thin film resistors 18 and 20 are used, they may be replaced by resistance elements. Furthermore, in the present embodiment, the regions M and N of the FET chip 1a have been discussed.

The regions M and N may be considered as separate FET chips. Furthermore, although the FET chips 1a and 1b are made of a GaAs FET, they may be made of any material as long as it is a transistor.

From the above results, Table 1 summarizes the effect of the presence/absence of the thin film resistor 18 or 20 formed on the surface of the incoming dielectric substrate 2 or the outgoing dielectric substrate 3 and the stability with respect to an abnormal oscillation.

TABLE 1

| Thin film resistor 18 | Thin film resistor 20 | Stability with respect to abnormal oscillation |
|---|---|---|
| Yes | Yes | Good |
| Yes | No | Unsatisfactory |
| No | Yes | Unsatisfactory |
| No | No | Poor |

Embodiment 2

Figure 4A:
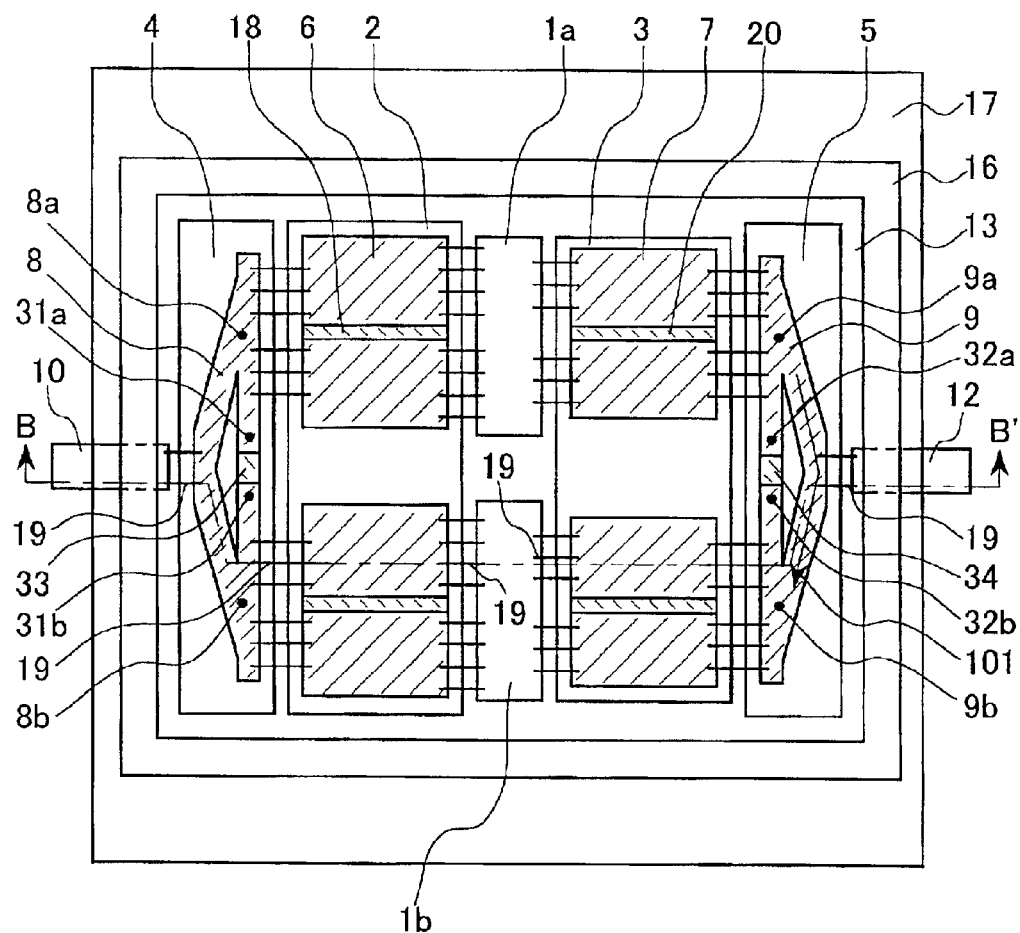
FIG. 4A is a plan view showing the inside of a GaAs power FET element having an internal matching circuit in Embodiment 2 according to the present invention.
Figure 4B:
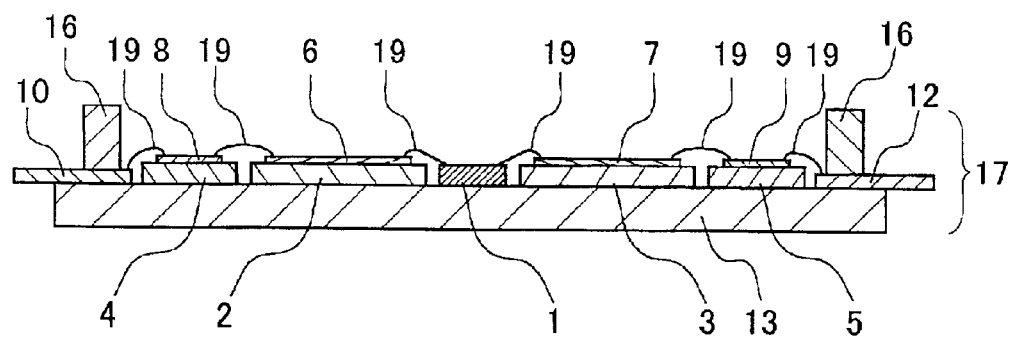
FIG. 4B is a cross-sectional view taken along a line B–B' in FIG. 4A.

FIGS. 4A and 4B are schematic views of a GaAs power FET element having an internal matching circuit of Embodiment 2 according to the present invention. FIG. 4A is a plan view showing the inside of an FET element, and FIG. 4B is a cross-sectional view taken along a line B–B'.

The difference between Embodiments 1 and 2 resides in that a thin film resistor 33 is formed between terminals 31a and 31b on the power dividing circuit 8 and a thin film resistor 34 is formed between terminals 32a and 32b on the power combining circuit 9.

Now, the case will be considered where there is a variation in $V_{th}$ and gm between the FET chips 1a and 1b. For example, in the case where a high-frequency power output from the FET chip 1a is larger than that output from the FET chip 1b, a difference is caused in power transmitted to input terminals 9a and 9b of the power combining circuit 9. In the case where the thin film resistor 34 is not formed, a roundabout power 101 is generated from the input terminal 9a to the input terminal 9b, which causes an abnormal oscillation. According to the actual measurement, when there is a difference of 0.3 V in a threshold voltage between the FET chips 1a and 1b, an abnormal oscillation is caused in the vicinity of a maximum output.

However, by providing the thin film resistor 34, even in the case where a difference is caused in power transmitted to the terminals 32a and 32b of the power combining circuit 9, an abnormal oscillation can be suppressed. The reason for this is as follows: due to the potential difference formed between the terminals 32a and 32b, a current flows through the thin film resistor 34, whereby power is consumed in an unbalanced manner. According to the actual measurement, an abnormal oscillation can be suppressed even when there is a difference of 0.5 V in a threshold voltage between the FET chips 1a and 1b.

Next, an input side will be considered. In the case where there is a variation in $V_{th}$ and gm between the FET chips 1a and 1b, a difference is caused in power to be input to the FET chips 1a and 1b. In the case where the thin film resistor 33 is not formed, a roundabout power is generated in the power dividing circuit 8, which results in an abnormal oscillation. In contrast, by providing the thin film resistor 33, a roundabout power passing therethrough is consumed, so that an abnormal oscillation can be suppressed.

Resistances $R_{33}$ and $R_{34}$ of the thin film resistors 33 and 34 and the stability with respect to an abnormal oscillation were studied. As a result, by setting the resistance $R_{38}$ so as to be equal to a resistance component of an impedance in the case of seeing the FET chip 1a (or 1b) side from the terminal 8a (or 8b), the largest effects were obtained. Furthermore, by setting the resistance $R_{34}$ so as to be equal to a resistance component of an impedance in the case of seeing the FET chip 1a (or 1b) side from the terminal 9a (or 9b), the largest effects were obtained.

In summary, by inserting resistors between the output terminals 8a and 8b of the power dividing circuit 8, and between the input terminals 9a and 9b of the power dividing circuit 9, an abnormal oscillation caused by a variation between the FET chips 1a and 1b can be suppressed.

Embodiment 3

Figure 5:
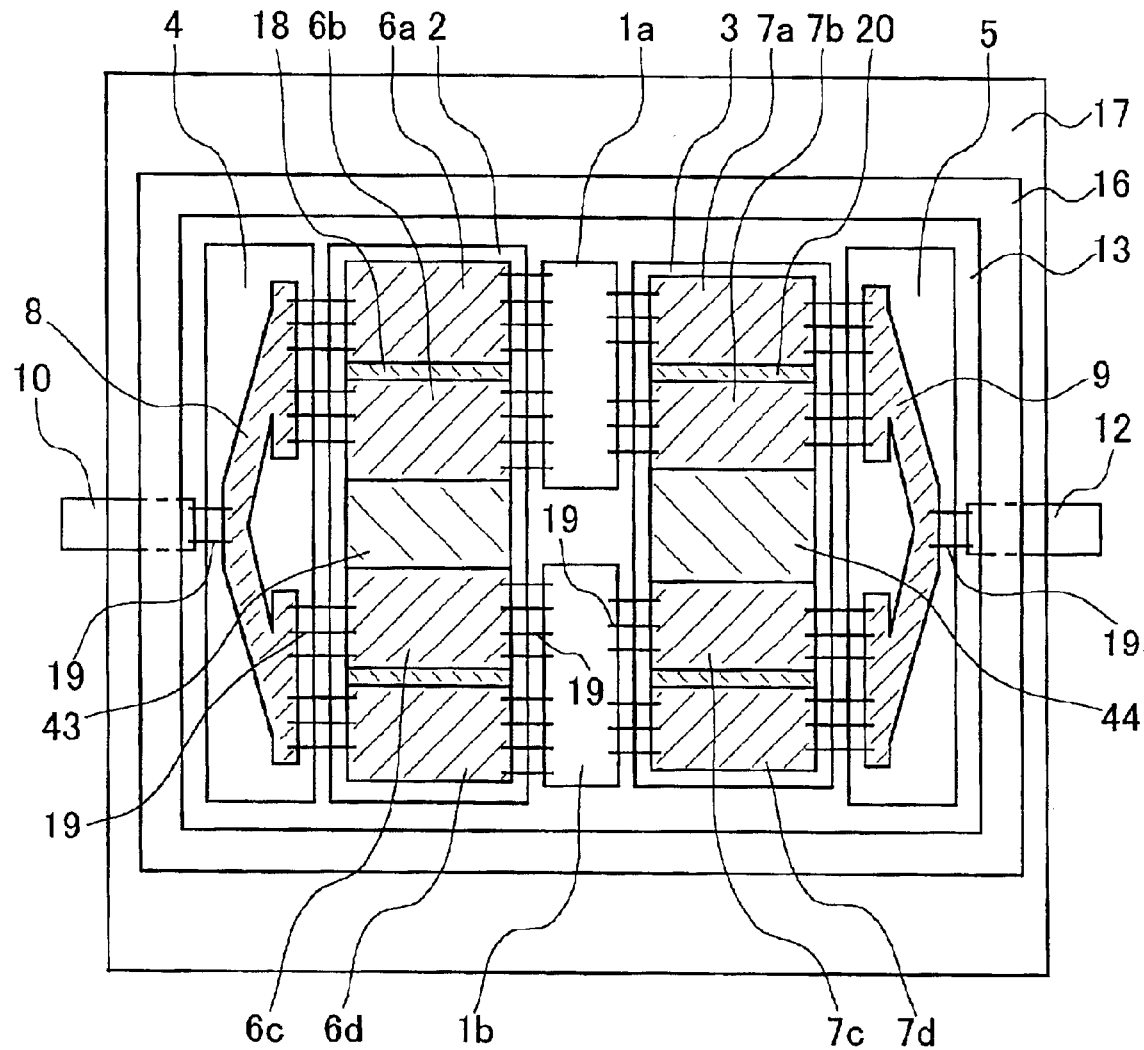
FIG. 5 is a plan view of a GaAs power FET element having an internal matching circuit in Embodiment 3 according to the present invention.

FIG. 5 is a plan view showing the inside of a GaAs power FET element having an internal matching circuit of Embodiment 3 according to the present invention. The difference between Embodiments 3 and 1 resides in that a thin film resistor 43 is formed between incoming distributed constant lines 6b and 6c, and a thin film resistor 44 is formed between outgoing distributed constant lines 7b and 7c.

Next, the difference in function between Embodiments 3 and 2 will be described. In Embodiment 2, by using the thin film resistor 33 (or 34) provided in the power dividing circuit 8 (or power combining circuit 9), an imbalance of power caused by the variation between the FET chips 1a and 1b is eliminated. However, the thin film resistors 33 and 34 are given as lumped constants, and in only these points, an imbalance of power can be eliminated. Therefore, the effect of suppressing an oscillation is not sufficient.

In Embodiment 3, in order to eliminate the imbalance of power, thin film resistors 43 and 44 are provided. The incoming distributed constant line 6 and the outgoing distributed constant line 7 have a length of λ/4 (λ is a wavelength) with respect to a used frequency. By providing the thin film resistor 43 between the incoming distributed constant lines 6b and 6c in a distributed constant manner, an imbalance of power can be absorbed effectively. The same results also are obtained from the outgoing distributed constant line 7. As a result of studying the resistances of the thin film resistors 43 and 44, sufficient results are obtained by setting the resistance between 5 Ω and 20 Ω.

Next, the incoming dielectric substrate 2 will be described in detail. The incoming dielectric substrate 2 has a size of 4 mm×11 mm and a thickness of 0.25 mm. The incoming distributed constant lines 6a to 6d have a size of 3 mm (length)×2 mm (width) and a characteristic impedance of 3 Ω.

The thin film resistor 18 is made of a material mainly containing tantalum nitride having a sheet resistance of 75 Ω/□. The thin film resistor 18 has a size of 3 mm×0.2 mm and a resistance of 5 Ω. The width of the thin film resistor 18 cannot be set larger than 0.2 mm since the FET chip 1a and two incoming distributed constant lines 6a and 6b are connected to each other via bonding wires.

The thin film resistor 43 is made of a material having a sheet resistance of 20 Ω/□. The thin film resistor 43 has a size of 3 mm×1.5 mm and a resistance of 10 Ω. Considering heat release for the FET chips 1a and 1b, the width of the thin film resistor 43 is set to be 1.5 mm. Furthermore, because of the heat release, the FET chips 1a and 1b preferably are spaced from each other by about 1.5 mm.

In summary, by placing the thin film resistor 43 between the incoming distributed constant lines 6b and 6c in a distributed constant manner, an imbalance of power can be absorbed effectively. Furthermore, the same results are obtained from the outgoing distributed constant line 7. Compared with Embodiment 2, the effect of suppressing an abnormal oscillation can be enhanced. The reason for this is as follows: the thin film resistor for eliminating an unbalanced power is provided in a power dividing (combining) circuit as a lumped constant in Embodiment 2, whereas the thin film resistor is provided as a distributed constant in the present embodiment. Although the thin film resistors 43 and 44 are used in the present embodiment, they may be any suitable resistance elements.

Embodiment 4

Before describing Embodiment 4, the problem in Embodiment 3 will be clarified. Regarding the production of the incoming dielectric substrate 2, the sheet resistance of the thin film resistor 18 is different from that of the thin film resistor 43. Therefore, it is necessary to produce the thin film resistors 18 and 43 in separate processes, which will increase the production cost.

Next, the reason why the sheet resistance of the thin film resistor 18 cannot be set to be equal to that of the thin film resistor 43 will be described. If the sheet resistance of the thin film resistor 18 is set to be 20 $\Omega/\square$ in accordance with the thin film resistor 43, in order to obtain a resistance of 5 $\Omega$, the width of the thin film resistor 18 is required to be 0.75 mm, which makes the shape of the bonding wires inappropriate. In contrast, if the sheet resistance of the thin film resistor 43 is set to be 75 $\Omega/\square$ in accordance with the thin film resistor 18, in order to obtain a resistance of 10 $\Omega$, the width of the thin film resistor 43 is required to be 0.4 mm. This narrows the interval between the FET chips 1a and 1b, which has an adverse effect on heat release.

Figure 6:
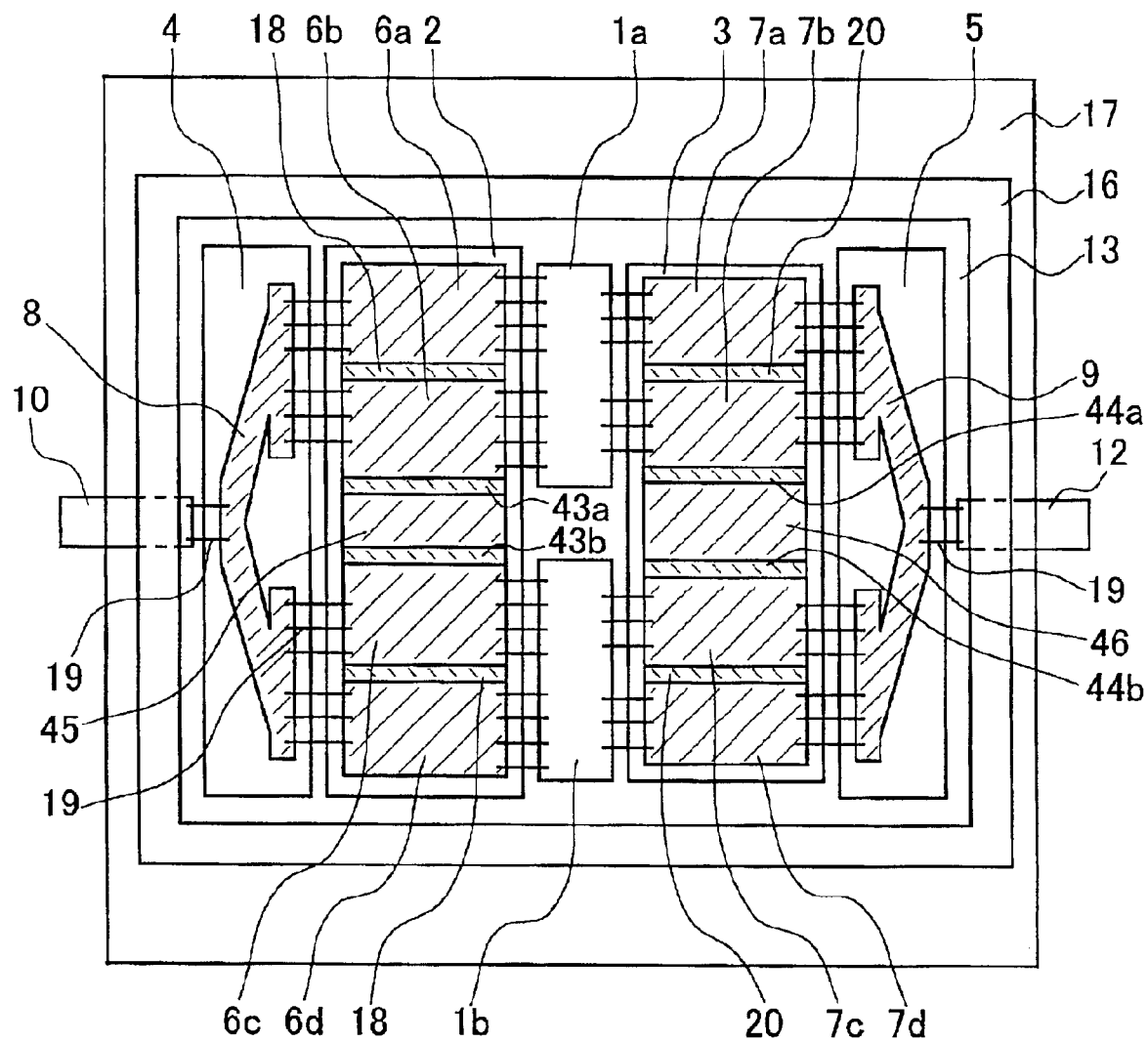
FIG. 6 is a plan view of a GaAs power FET element having an internal matching circuit in Embodiment 4 according to the present invention.

FIG. 6 is a plan view showing the inside of a GaAs power FET element having an internal matching circuit of Embodiment 4 according to the present invention. The difference between Embodiments 4 and 3 resides in that a thin film resistor 43a, a conductor line 45, and a thin film resistor 43b are formed successively between the incoming distributed constant lines 6b and 6c, and in that a thin film resistor 44a, a conductor line 46, and a thin film resistor 44b are formed successively between the outgoing distributed constant lines 7b and 7c.

The conductor line 45 is made of the same material as that for the incoming distributed constant line 6, and has a width of 1.1 mm. The thin film resistors 43a and 43b are made of a material having a sheet resistance of 75 $\Omega/\square$. The thin film resistors 43a and 43b have a width of 0.2 mm and a resistance of 5 $\Omega$. The thin film resistor 18 also is made of a material having a sheet resistance of 75 $\Omega/\square$. The thin film resistor 18 has a width of 0.2 mm and a resistance of 5 $\Omega$.

By providing the conductor line 45, the interval and resistance of the incoming distributed constant lines 6b and 6c can be set at 1.5 mm and 10 $\Omega$, respectively, while keeping the sheet resistances of the thin film resistors 18, 43a, and 43b at the same value. This also applies to the output side. By providing the conductor line 46, the interval and resistance of the outgoing distributed constant lines 7b and 7c can be designed appropriately, while keeping the sheet resistances of the thin film resistors 20, 44a, and 44b at the same value.

In the present embodiment, the thin film resistor, the conductor line, and the thin film resistor are inserted successively between the incoming distributed constant lines 6b and 6c. However, only the thin film resistor and the conductor line may be inserted successively, if desired.

Embodiment 5

Figure 7:
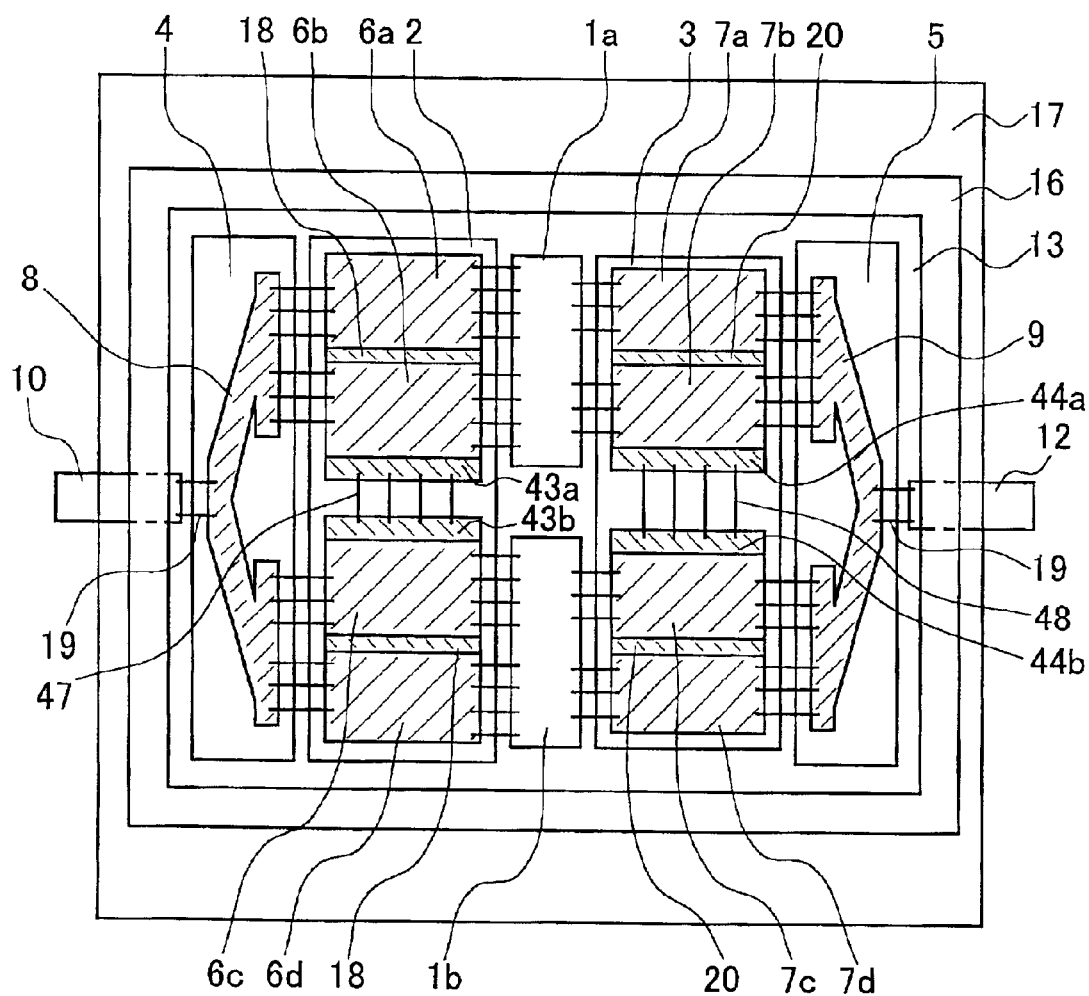
FIG. 7 is a plan view of a GaAs power FET element having an internal matching circuit in Embodiment 5 according to the present invention.

FIG. 7 is a plan view of a GaAs power FET element having an internal matching circuit of Embodiment 5 according to the present invention. For simplicity, only the incoming dielectric substrate 2 will be described. The difference between Embodiments 5 and 4 resides in that thin film resistors 43a and 43b and the thin film resistors 44a and 44b are connected to each other via bonding wires 47 and 48 without providing the conductor lines 45 and 46. Compared with Embodiment 4, the suppression effect of an abnormal oscillation becomes slightly low due to the effect of an inductance of the bonding wires.

On the other hand, it is not required to form the conductor lines 45 and 46 on the dielectric substrates 2 and 3. Therefore, the dielectric substrates 2 and 3 can be miniaturized, and a low cost can be achieved. Furthermore, even in the case where the interval between the FET chips 1a and 1b is changed, by adjusting the length of the bonding wires, it becomes possible to use the same dielectric substrates 2 and 3, which enhances the flexibility of design and mounting.

Embodiment 6

Figure 8:
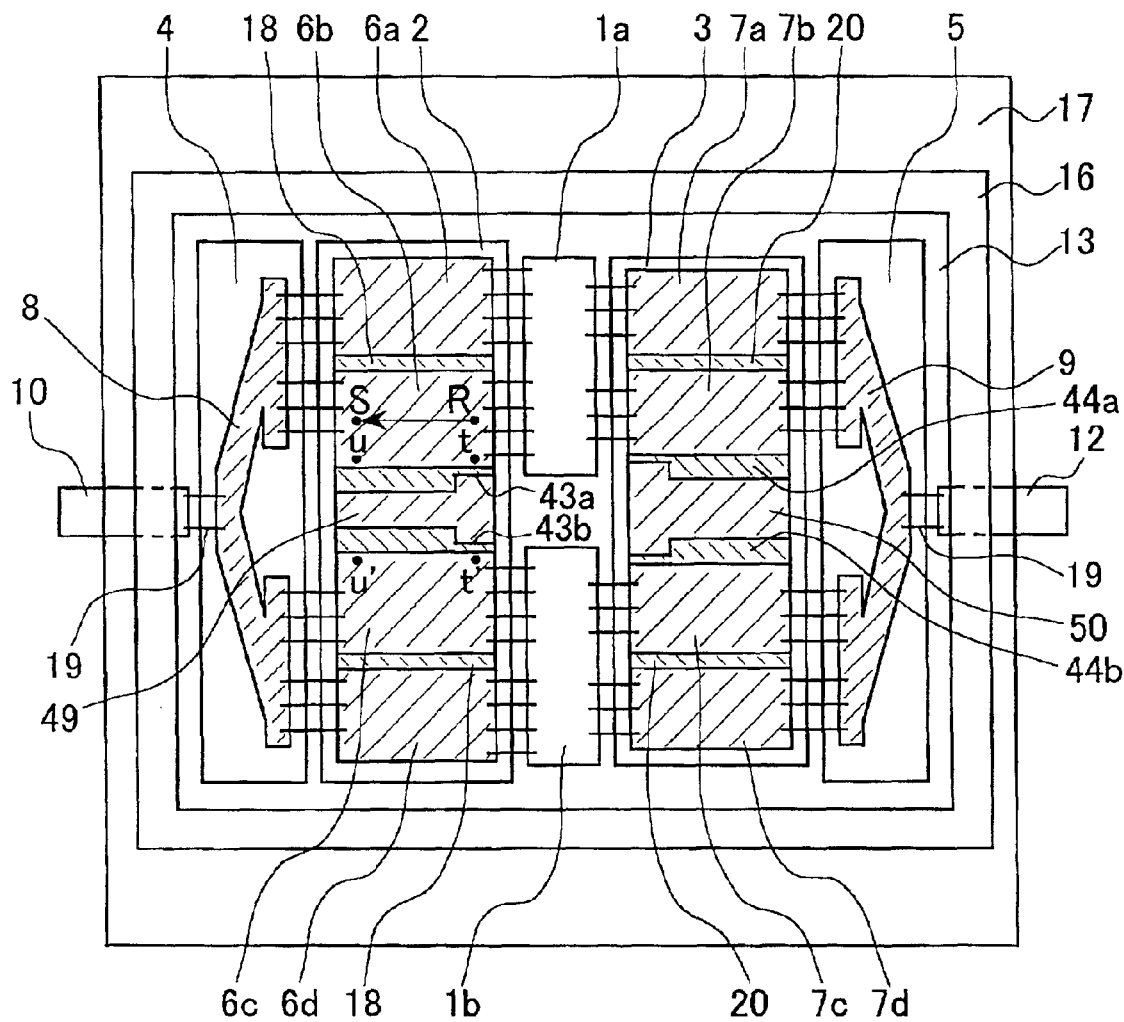
FIG. 8 is a plan view of a GaAs power FET element having an internal matching circuit in Embodiment 6 according to the present invention.

FIG. 8 is a plan view of a GaAs power FET element having an internal matching circuit of Embodiment 6 according to the present invention. For simplicity, only the incoming dielectric substrate 2 will be described. The difference between Embodiments 6 and 4 resides in that the conductor lines 49 and 50 have a T-shape.

As described in Embodiment 1 with reference to FIG. 2, an impedance in the case of seeing the FET chip 1a from each point in the incoming distributed constant line 6b becomes lowest at a point R and becomes higher toward a point S along an arrow. Therefore, by designing the resistance distribution between the incoming distributed constant lines 6b and 6c to be low between t–t' and high between u–u', an unbalanced power becomes more likely to be eliminated in the thin film resistors 43a and 43b. By forming the conductive lines 49 and 50 in a T-shape, enlarging the widths thereof on the FET chips 1a and 1b side, and making them narrower on the power dividing circuit 8 side, the resistance between t–t' becomes low, and the resistance between u–u' becomes high. Consequently, the effect of suppressing an abnormal oscillation further can be enhanced.

Embodiment 7

Figure 9:
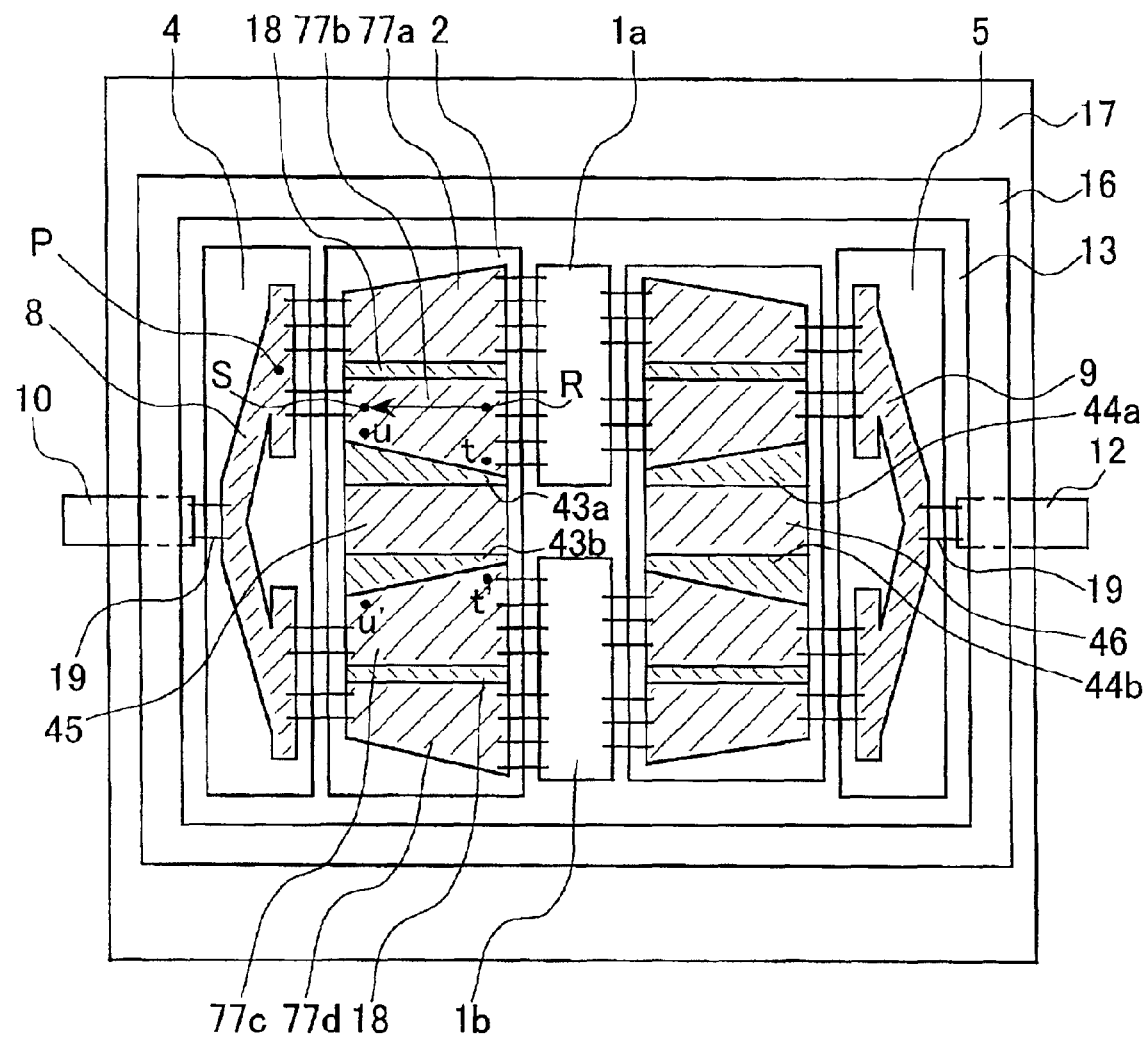
FIG. 9 is a plan view of a GaAs power FET element having an internal matching circuit in Embodiment 7 according to the present invention.

FIG. 9 is a plan view of a GaAs power FET element having an internal matching circuit of Embodiment 7 according to the present invention. For simplicity, only the incoming dielectric substrate 2 will be described. The difference between Embodiments 7 and 4 resides in that incoming distributed constant lines 77a, 77b, 77c, and 77d are formed in a trapezoidal shape.

Figure 10:
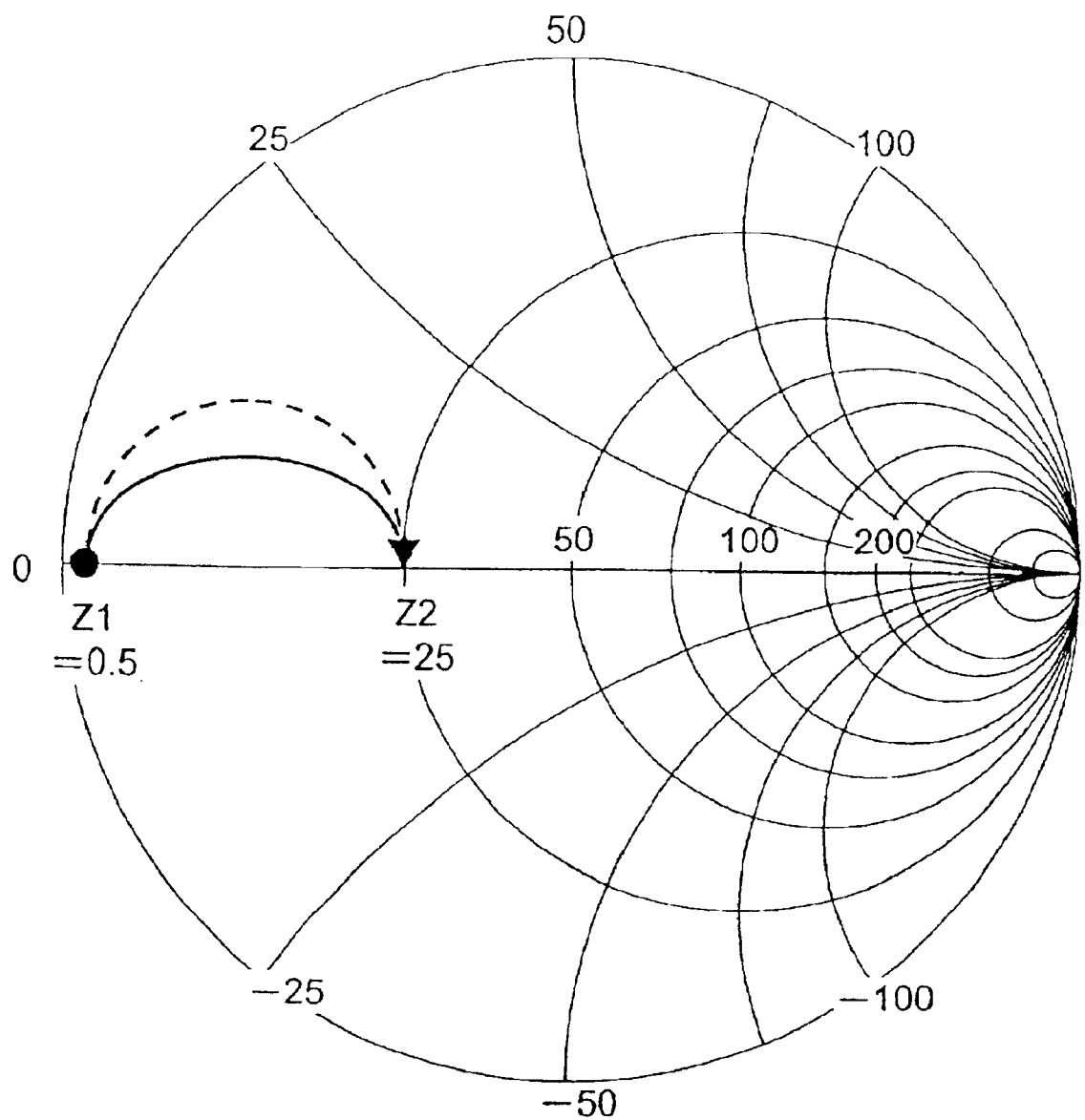
FIG. 10 is a Smith chart showing impedance matching by a distributed constant line in Embodiment 7 according to the present invention.

In the incoming distributed constant line 77b, a characteristic impedance thereof increases gradually from a point R to a point S. It is assumed that an input impedance of the FET chip 1a is Z1, and an impedance in the case of seeing the FET chip 1a side from the point P is Z2. When Z1=0.5 $\Omega$ and Z2=25 $\Omega$, impedance conversion by the incoming distributed constant line 77 is as presented by a solid arrow in FIG. 10. In the case where the incoming distributed constant lines 77a, 77b, 77c, and 77d have a rectangular shape, the impedance conversion is as represented by a broken arrow. Compared with the impedance conversion represented by the broken arrow, the impedance conversion represented by the solid arrow in the present embodiment is within a region where a Q-value is low in the Smith chart. More specifically, by forming the incoming distributed constant lines 77a, 77b, 77c, and 77d in a trapezoidal shape, a wider band can he realized.

Next, a propagation path of a high frequency on the incoming 20 distributed constant lines 77a, 77b, 77c, and 77d will be considered. For example, a high frequency propagating through the incoming distributed constant line 77b is considered. A transmission difference between a high frequency passing through the thin film resistor 18 side and a high frequency passing through the thin film resistor 43a side can be decreased. More specifically, by forming the incoming distributed constant line 77b in a trapezoid shape, an adverse effect of the phase difference in a high frequency can be reduced.

Furthermore, since the resistance distribution between the incoming distributed constant lines 77b and 77c can be switched continuously so that it becomes low between t–t' and high between u–u', the effect of suppressing an abnormal oscillation further is enhanced.

In summary, by forming the incoming distributed constant lines 77a, 77b, 77c, and 77d in a trapezoid shape, (1) a wide band can be realized, (2) an adverse effect by the phase difference in a high frequency can be reduced, and (3) the effect of suppressing an abnormal oscillation further can be enhanced.

Embodiment 8

In general, a characteristic impedance is varied between the incoming and outgoing distributed constant lines, due to the difference in desired impedance conversion. In the FET element of Embodiment 1, the characteristic impedance of the incoming distributed constant lines 6a to 6d is 3 Ω, whereas the characteristic impedance of the outgoing distributed constant lines 7a to 7c is set to be 5 Ω. Furthermore, even in the case of using the same FET chip, the characteristic impedance of distributed constant lines is varied depending upon the specification of an output power and the like desired for the FET element.

In the conventional FET element, by adjusting the thickness of the distributed constant line, the characteristic impedance is controlled. Therefore, the shape of a pattern including the thickness of distributed constant lines is varied between the input side and the output side. Furthermore, the shape of the pattern is changed in accordance with a desired specification, so that a number of masks for forming the pattern are required. Furthermore, when a minute change is made with respect to a characteristic impedance, it is required to start the production process from mask production, which requires a long period of time for designing.

Embodiment 8 of the present invention solves the above-mentioned problems.

Figure 11A:
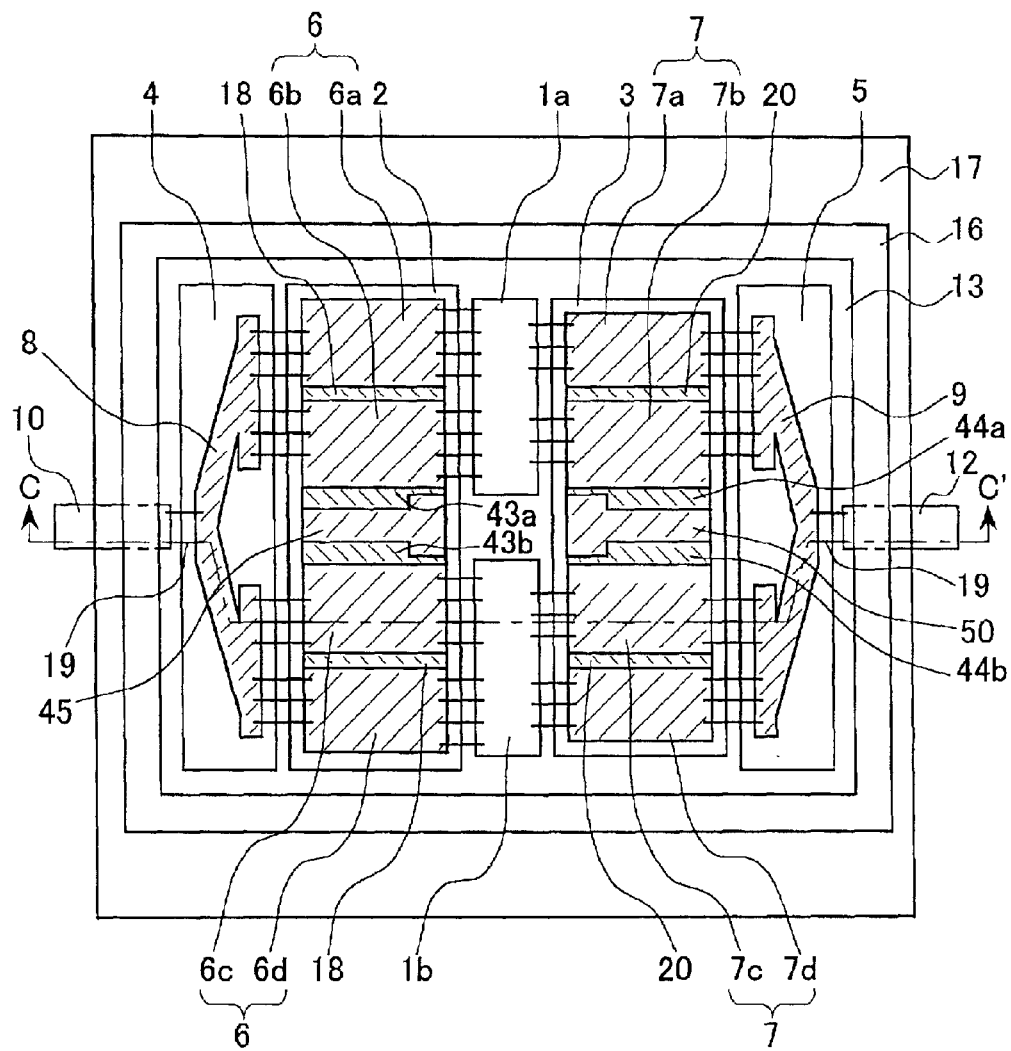
FIG. 11A is a plan view showing the inside of a GaAs power FET element having an internal matching circuit in Embodiment 8 according to the present invention.
Figure 11B:
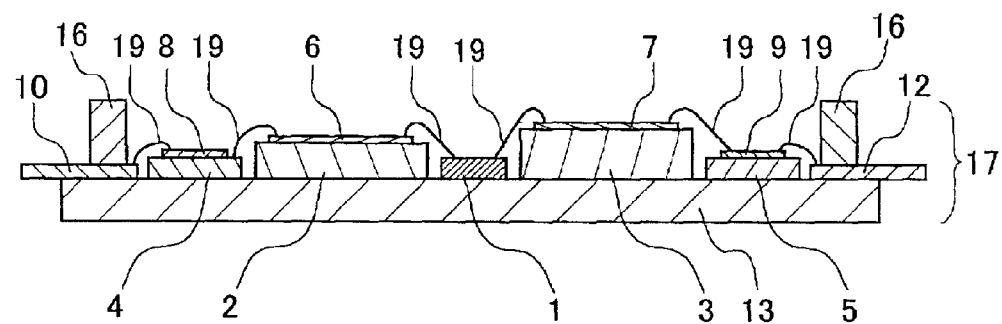
FIG. 11B is a cross-sectional view taken along a line C–C' in FIG. 11A.

FIGS. 11A and 11B are schematic views of a GaAs power FET element having an internal matching circuit of Embodiment 8 according to the present invention. FIG. 11A is a plan view showing the inside of the FET element, and FIG. 11B is a cross-sectional view taken along a line C–C' in FIG. 11A.

The difference between Embodiments 8 and 4 resides in that the thickness of the incoming dielectric substrate 2 is different from that of the outgoing dielectric substrate 3, and patterns formed on the surfaces of both the substrates are the same. The thickness of the incoming dielectric substrate is 0.25 mm, and the thickness of the outgoing dielectric substrate is 0.4 mm. The width of the incoming distributed constant line 6 and the outgoing distributed constant line 7 are 2 mm, respectively. However, due to the difference in thickness of the substrates, the characteristic impedances thereof are 3 Ω and 5 Ω, respectively.

By varying the thickness of the dielectric substrate between the input side and the output side, it becomes possible to produce distributed constant lines having different characteristic impedances with the same mask pattern. Furthermore, to provide a minute change in a characteristic impedance, a pattern is formed previously, and thereafter, the thickness is changed minutely, whereby such a minute change can be made. Therefore, a design time can be shortened substantially. Furthermore, various characteristic impedances can be realized with distributed constant lines with the same pattern. Therefore, a number of kinds of products can be achieved in accordance with desired characteristics without changing the setting of a production facility.

As described above, according to the present invention, at least the following effects can be obtained in a high-frequency GaAs power FET element having an internal matching circuit.

(1) Since an unbalanced power caused in incoming (outgoing) distributed constant lines can be eliminated by using a thin film resistor, an abnormal oscillation can be suppressed, which enhances the reliability of the FET element.

(2) Since an unbalanced power caused in power dividing (combining) circuits can be eliminated by using a thin film resistor, an abnormal oscillation can be suppressed, which enhances the reliability of the FET element.

(3) Since various characteristic impedances are realized with distributed constant lines having the same pattern, a number of kinds of products can be achieved in accordance with desired characteristics without changing the setting of a production facility.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A high-frequency semiconductor device, comprising:
   an amplifier;
   a dielectric substrate provided on an input side or an output side of the amplifier;
   a plurality of transmission lines formed on a surface of the dielectric substrate and connected electrically to the amplifier, the transmission lines each having an electrical length of substantially λ/4 with respect to an operation frequency; and
   a thin film resistor formed between the plurality of transmission lines,
   wherein the thin film resistor has the same length as that of the plurality of transmission lines in a traveling direction of a high-frequency power and the same width as that of a gap between the plurality of transmission lines.

2. A high-frequency semiconductor device according to claim 1, wherein widths of the plurality of transmission lines are made larger on the amplifier side and smaller on the other side.

3. A high-frequency semiconductor device, comprising:
   first and second amplifiers;
   a dielectric substrate provided on an input side or an output side of the first and second amplifiers;
   a first transmission line formed on a surface of the dielectric substrate and connected electrically to the first amplifier, the first transmission line having an electrical length of substantially λ/4 with respect to an operation frequency;
   a second transmission line formed on a surface of the dielectric substrate and connected electrically to the second amplifier, the second transmission line having an electrical length of substantially λ/4 with respect to an operation frequency; and a thin film resistor formed between the first and second transmission lines, wherein the thin film resistor has the same length as that of the first and second transmission lines in a traveling direction of a high-frequency power and the same width as that of a gap between the first and second transmission lines.

4. A high-frequency semiconductor device according to claim 3, wherein widths of the first and second transmission lines are made larger on the first and second amplifiers side and smaller on the other side.

5. A high-frequency semiconductor device, comprising:

first and second amplifiers;

a dielectric substrate provided on an input side or an output side of the first and second amplifiers;

a first transmission line formed on a surface of the dielectric substrate and connected electrically to the first amplifier, the first transmission line having an electrical length of substantially $\lambda/4$ with respect to an operation frequency;

a second transmission line formed on a surface of the dielectric substrate and connected electrically to the second amplifier, the second transmission line having an electrical length of substantially $\lambda/4$ with respect to an operation frequency;

a third transmission line formed on a surface of the dielectric substrate between the first and second transmission lines, the third transmission line having an electrical length of substantially $\lambda/4$ with respect to an operation frequency;

a first thin film resistor formed between the first and third transmission lines and having the same width as that of a gap between the first and third transmission lines; and a second thin film resistor formed between the second and third transmission lines and having the same width as that of a gap between the second and third transmission lines, wherein the first and second film resistors have the same length as that of the first to third transmission lines in a traveling direction of a high-frequency power.

6. A high-frequency semiconductor device according to claim 5, wherein widths of the first and second transmission lines are made larger on the first and second amplifier side and smaller on the other side.

7. A high-frequency semiconductor device according to claim 5, wherein a width of the third transmission line is made larger on the first and second amplifiers side and smaller on the other side.

8. A high-frequency semiconductor device, comprising:

first and second amplifiers;

a dielectric substrate provided on an input side or an output side of the first and second amplifiers;

first and second transmission lines formed on a surface of the dielectric substrate and connected electrically to the first amplifier, the first and second transmission lines having an electrical length of substantially $\lambda/4$ with respect to an operation frequency;

third and fourth transmission lines formed on a surface of the dielectric substrate and connected electrically to the second amplifier, the third and fourth transmission lines having an electrical length of substantially $\lambda/4$ with respect to an operation frequency;

a first thin film resistor formed between the first and second transmission lines and having the same width as that of a gap between the first and third transmission lines;

a second thin film resistor formed between the second and third transmission lines; and a third thin film resistor formed between the third and fourth transmission lines and having the same width as that of a gap between the third and fourth transmission lines, wherein the first to third thin film resistors have the same length as that of the first to fourth transmission lines in a traveling direction of a high-frequency power.

9. A high-frequency semiconductor device, comprising:

first and second amplifiers;

a dielectric substrate provided on an input side or an output side of the first and second amplifiers;

first and second transmission lines formed on a surface of the dielectric substrate and connected electrically to the first amplifier, the first and second transmission lines having an electrical length of substantially $\lambda/4$ with respect to an operation frequency;

third and fourth transmission lines formed on a surface of the dielectric substrate and connected electrically to the second amplifier, the third and fourth transmission lines having an electrical length of substantially $\lambda/4$ with respect to an operation frequency;

a fifth transmission line formed between the second and third transmission lines and having an electrical length of substantially $\lambda/4$ with respect to an operation frequency;

a first thin film resistor formed between the first and second transmission lines and having the same width as that of a gap between the first and second transmission lines;

a second thin film resistor formed between the third and fourth transmission lines and having the same width as that of a gap between the third and fourth transmission lines;

a third thin film resistor formed between the second and third transmission lines and having the same width as that of a gap between the second and third transmission lines; and a fourth thin film resistor formed between the fifth and third transmission lines and having the same width as that of a gap between the fifth and third transmission lines, wherein the first to fourth thin film resistors have the same length as that of the first to fifth transmission lines in a traveling direction of a high-frequency power.

10. A high-frequency semiconductor device, comprising:

first and second amplifiers;

a dielectric substrate provided on an input side or an output side of the first and second amplifiers;

first and second transmission lines formed on a surface of the dielectric substrate and connected electrically to the first amplifier, the first and second transmission lines having an electrical length of substantially $\lambda/4$ with respect to an operation frequency;

third and fourth transmission lines formed on a surface of the dielectric substrate and connected electrically to the second amplifier, the third and fourth transmission lines having an electrical length of substantially $\lambda/4$ with respect to an operation frequency;

a first thin film resistor formed between the first and second transmission lines and having the same width as that of a gap between the first and second transmission lines;

a second thin film resistor formed between the third and fourth transmission lines and having the same width as that of a gap between the third and fourth transmission lines;

a third thin film resistor connected to an end of the second transmission line opposed to the third transmission line;

a fourth thin film resistor connected to an end of the third transmission line opposed to the second transmission line; and a unit for connecting the third and fourth resistors electrically;

wherein the first to fourth thin film resistors have the same length as that of the first to fourth transmission lines in a traveling direction of a high-frequency power.

11. A high-frequency semiconductor device, comprising:

first and second amplifiers;

a dielectric substrate provided on an output side or an input side of the first and second amplifiers;

first and second transmission lines formed on a surface of the dielectric substrate and connected electrically to the first amplifier, the first and second transmission lines having an electrical length of substantially $\lambda/4$ with respect to an operation frequency;

third and fourth transmission lines formed on a surface of the dielectric substrate and connected electrically to the second amplifier, the third and fourth transmission lines having an electrical length of substantially $\lambda/4$ with respect to an operation frequency;

a first thin film resistor formed between the first and second transmission lines and having the same length as that of the first and second transmission lines in a traveling direction of a high-frequency power and the same width as that of a gap between the first and second transmission lines;

a second thin film resistor formed between the third and fourth transmission lines and having the same length as that of the third and fourth transmission lines in a traveling direction of a high-frequency power and the same width as that of a gap between the third and fourth transmission lines;

a first input terminal or output terminal on a power combining circuit connected electrically to a side of the first and second transmission lines opposite to a side thereof connected to the first amplifier;

a second input terminal or output terminal on the power combining circuit connected electrically to a side of the third and fourth transmission lines opposite to a side thereof connected to the second amplifier; and a third resistor connected between the first input terminal and the second input terminal or between the first output terminal and the second output terminal.

12. A high-frequency semiconductor device, comprising:

first and second amplifiers;

a dielectric substrate provided on an output side or an input side of the first and second amplifiers;

first and second transmission lines formed on a surface of the dielectric substrate and connected electrically to the first amplifier, the first and second transmission lines having an electrical length of substantially $\lambda/4$ with respect to an operation frequency;

third and fourth transmission lines formed on a surface of the dielectric substrate and connected electrically to the second amplifier, the third and fourth transmission lines having an electrical length of substantially $\lambda/4$ with respect to an operation frequency;

a fifth transmission line formed between the second and third transmission lines and having an electrical length of substantially $\lambda/4$ with respect to an operation frequency;

a first thin film resistor formed between the first and second transmission lines and having, the same length as that of the first and second transmission lines in a traveling direction of a high-frequency power and the same width as that of a gap between the first and second transmission lines;

a second thin film resistor formed between the third and fourth transmission lines and having the same length as that of the third and fourth transmission lines in a traveling direction of a high-frequency power and the same width as that of a gap between the third and fourth transmission lines;

a third thin film resistor formed between the second and fifth transmission lines and having the same length as that of the second and fifth transmission lines in a traveling direction of a high-frequency power and the same width as that of a gap between the second and fifth transmission lines; and a fourth thin film resistor formed between the fifth and third transmission lines and having the same length as that of the fifth and third transmission lines in a traveling direction of a high-frequency power and the same width as that of a may between the fifth and third transmission lines, a first input terminal or output terminal on a power combining circuit connected electrically to a side of the first and second transmission lines opposite to a side thereof connected to the first amplifier; and a second input terminal or output terminal on the power combining circuit connected electrically to a side of the third and fourth transmission lines opposite to a side thereof connected to the second amplifier.

13. A high-frequency semiconductor device, comprising:

an amplifier;

an incoming dielectric substrate provided on an input side of the amplifier;

an outgoing dielectric substrate provided on an output side of the amplifier and having a thickness different from that of the incoming dielectric substrate;

a plurality of incoming transmission lines formed on a surface of the incoming dielectric substrate and connected electrically to the amplifier; and a plurality of incoming transmission lines formed on a surface of the outgoing dielectric substrate and connected electrically to the amplifier, the outgoing transmission line having the same width as that of the incoming transmission line;

an incoming thin film resistor disposed between the incoming transmission lines so as to form a distributed constant; and an outgoing thin film resistor disposed between the outgoing transmission lines so as to form a distributed constant.

* * * * *